United States Patent [19]

Craft

[11] Patent Number: 4,941,067
[45] Date of Patent: Jul. 10, 1990

[54] THERMAL SHUNT FOR ELECTRONIC CIRCUITS

[75] Inventor: Scott Craft, Phoenix, Ariz.

[73] Assignee: Motorola Inc., Schaumburg, Ill.

[21] Appl. No.: 334,409

[22] Filed: Apr. 7, 1989

[51] Int. Cl.⁵ .............................................. H05H 7/20
[52] U.S. Cl. .................................... 361/386; 165/185;
 174/16.3; 357/81; 361/386; 361/388
[58] Field of Search ................................. 361/386–389,
 361/414; 165/80.3, 185; 174/16.3; 357/81;
 29/832, 840

[56] References Cited

U.S. PATENT DOCUMENTS

| | | | |
|---|---|---|---|
| 3,061,760 | 10/1962 | Ezzo | 361/387 |
| 4,254,447 | 3/1981 | Griffis | 361/389 |
| 4,396,936 | 8/1983 | McIver et al. | 357/81 |

FOREIGN PATENT DOCUMENTS 3305167  8/1984  Fed. Rep. of Germany ...... 361/387

*Primary Examiner*—Gregory D. Thompson
*Attorney, Agent, or Firm*—Robert Handy

[57] ABSTRACT

Electrically insulating but thermally conductive "heat shunt" components are attached to PC boards along with regular electronic components to improve heat dissipation. The heat shunts are typically a small bar of thermally conductive ceramic with spaced-apart metal mounting pads on the ends for soldering to the PC board. Their shape is similar to standard electronic components for placement by automatic machinery and they extend, for example, from a transistor collector contact pad on the PC board to an adjacent ground lead having holes plated through to the metal back plane of the PC board in contact with the heat sink.

17 Claims, 2 Drawing Sheets

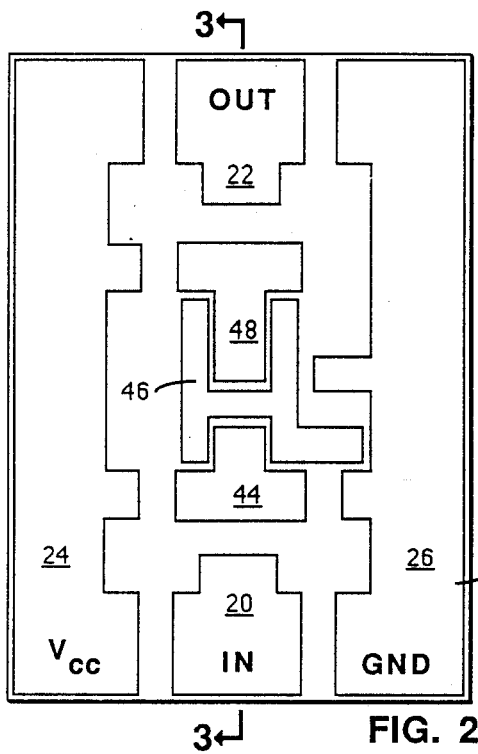
FIG. 2
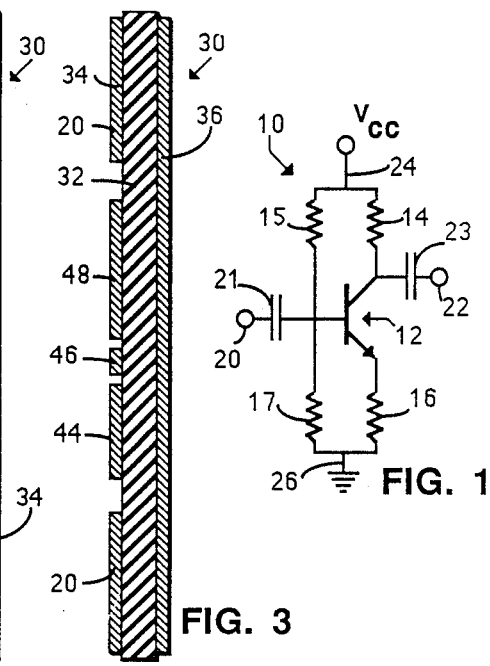
FIG. 3
FIG. 1
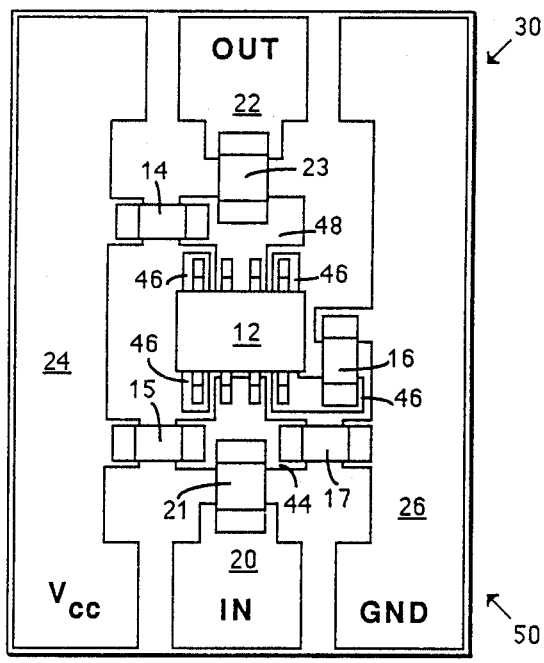
FIG. 4
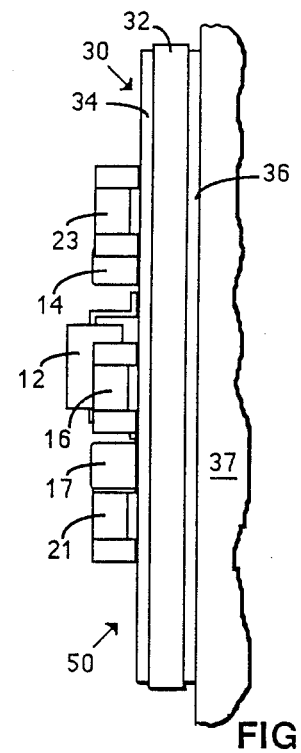
FIG. 5

THERMAL SHUNT FOR ELECTRONIC CIRCUITS

FIELD OF THE INVENTION

This invention concerns an improved means and method for reducing the operating temperature of components in electronic assemblies and, more particularly but not exclusively, for reducing the operating temperature in electronic assemblies employing a circuit board for supporting surface mount components.

BACKGROUND OF THE INVENTION

It is common in the electronics art to form electronic assemblies containing many different electronic components attached to a printed circuit board (PCB). The PCB is frequently formed from a paper, cloth and/or glass reinforced plastic substrate to which metal foil has been applied. The metal foil is etched or otherwise delineated to create conductive metal interconnection lines and bonding or mounting pads for the various components.

In dense surface mount PCB construction, the attainable power dissipation of the components is often severely limited by the combined thermal resistance of the surface mount component package and the PCB. For example, present day low cost surface mount transistor packages have a thermal resistance in the range of about 45° C./watt for an SO-8 type package to about 220° C./watt for an SOT-23 type package. SO-8 and SOT-23 are standard package outline designations well known in the art.

In determining the overall thermal resistance from the electronic device, e.g., a transistor die, to the heat sink where the heat is absorbed, the thermal resistance of the PCB must be added to that of the package. The PCB can add a large amount of thermal resistance. High thermal resistance is undesirable since it results in higher component operating temperatures for the same power dissipation, which in turn shortens the operating life of the component. The above-described problem is especially severe for electronic assemblies operating in the radio frequency range, e.g., above about 1 Megahertz and particularly above about 100 Megahertz. The higher the desired operating frequency the more difficult the problem since, in general, the negative impact of parasitic capacitance and/or inductance increases with operating frequency. To be useful at high frequencies, the solutions to the thermal dissipation problem must be low in all parasitics.

In the past, various attempts have been made to reduce the thermal resistance of components mounted on PCB's. For example, ceramic materials such as alumina or beryllia are used for the PCB substrate, but they have the disadvantage of being very expensive compared to conventional reinforced plastic type PCB's. Alternatively, stud mounted electronic components are used where the electronic chip or die is mounted on a metallic stud that passes through a hole in the PCB and attaches directly to an underlying heat sink. However, stud mount packages are not useful for surface mount assembly and it is expensive to electrically isolate the die from the stud or the stud from the heatsink.

Alternatively, a hole may be provided in the PCB through which a portion of the external heat sink protrudes so as to come into direct contact with the individual device or component package mounted on the PCB. However, this arrangement is not useful with many different types of components and often does not provide sufficient heat removal from plastic encapsulated components. In a still further approach to improve heat removal, the entire PCB assembly may be immersed in a coolant fluid, but this requires expensive exterior packaging and fluid circulating means.

None of the foregoing prior art techniques are suitable for electronic assemblies when very low cost is an important consideration, and particularly when surface mount assembly is desired. Accordingly, it is an object of the present invention to provide a means and method for low cost electronic assemblies having improved power dissipation capabilities and/or lower operating temperature.

It is a further object to provide improved power dissipation capabilities and/or lower operating temperature in electronic assemblies utilizing PCB's, especially reinforced plastic based PCB's.

It is an additional object to provide improved power dissipation capabilities and/or lower operating temperature in electronic assemblies adapted for surface mount assembly, especially those adapted for automated assembly using machine placeable components.

BRIEF SUMMARY OF THE INVENTION

The foregoing and other objects and advantages are achieved by a structure comprising, a PCB having first and second metal regions on a first face and a third metal region overlapping the second region on an opposed second face, a power dissipating component thermally connected to the first region, and an electrically insulating and thermally conducting component (e.g., a thermal shunt component) connected from the first region to the second region. It is desirable that the second and third regions have a highly thermally conducting interconnection, as for example, a plated through hole or the like located near the attachment point of the thermally conducting component.

It is important that the thermally conducting component have a thermal resistance equal to or less than the thermal resistance of the portion of the PCB occupied by the thermally conducting component. It is also desirable that the thermally conducting component have a form which is sufficiently similar in shape to other standard components on the PCB so that it may be placed on the board by the same means used for placing other components.

An example of a suitable thermal component is a parallelepiped of highly thermally conducting, electrically insulating, dielectric (e.g., alumina, beryllia, aluminum nitride, sapphire or combinations thereof) with spaced-apart metal attachment zones on one face for attachment to the first and second metal regions of the PCB. A third metal zone on the opposite face of the dielectric parallelepiped and overlapping but not contacting the first and second zones can further reduce the thermal impedance.

The above-described electronic assembly is formed by the process of providing a PCB having a first metal region for receiving a thermal connection from a power dissipating component, having a second metal region on the same face of the PCB spaced-apart from the first metal region, and having a third metal region on an opposite face of the PCB and thermally coupled to the second metal region, and in either order, placing a power dissipating component in thermal contact with the first metal region and placing a thermally conducting and electrically insulating component between the first and second metal regions and thermally coupled thereto. It is further desirable that the step of providing the PCB comprise providing a PCB having a one or more further metal conductors extending directly between the second and third metal regions and, preferably, near the point where the thermally conducting component couples to the second metal region.

The invented means and method will be better understood by considering the accompanying drawings and the description that follows.

BRIEF DESCRIPTION OF THE DRAWINGS

FIG. 1 shows a simplified schematic circuit diagram of an rf amplifier;

FIG. 2 shows a simplified plan view of a PCB whose metal layers have been etched to permit implementation of the circuit of FIG. 1;

FIG. 3 shows a cross-sectional view of the PCB of FIG. 2 along section line 3—3;

FIGS. 4 shows a simplified plan view of the same PCB as in FIG. 2 but with electronic components attached to form an assembly implementing the circuit of FIG. 1;

FIG. 5 show a simplified right side view of the electronic assembly of FIG. 3;

DETAILED DESCRIPTION OF THE DRAWINGS

Figure 6:
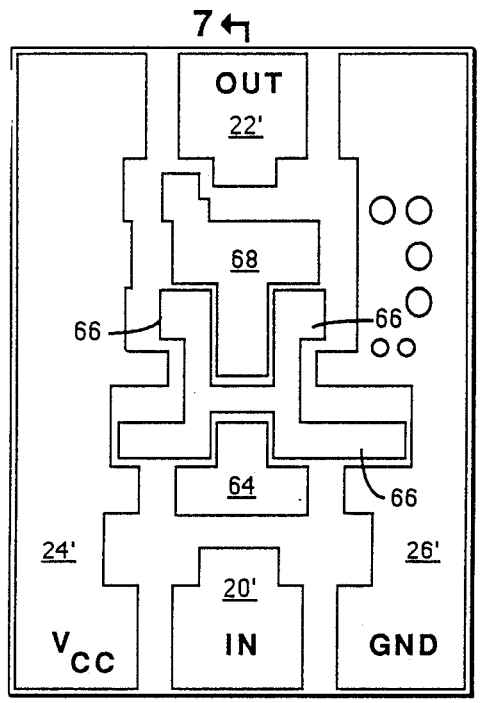
FIG. 6 shows a simplified plan view of a PCB similar to FIG. 2 whose metal layers have been etched to permit implementation of the circuit of FIG. 1, but according to the present invention wherein the PCB is adapted to receive thermal shunt components.

FIG. 1 shows simplified schematic circuit diagram of rf amplifier 10 comprising transistor 12, resistors 14–17, input 20 and input coupling capacitor 21, output 22 and output coupling capacitor 23, power supply connection 24 (e.g., $V_{cc}$), and ground or common connection 26. Amplifier 10 is conventional. For convenience in comparing the physical arrangement of components in FIGS. 2–5 with the schematic arrangement indicated in FIG. 1, the same identifying numbers have been used for the connections and components in the layout of FIGS. 2–5 as in the schematic of FIG. 1.

FIG. 2 shows a simplified plan view of PCB 30 comprising insulating substrate 32, first metal layer 34 on a first face of PCB substrate 32 and second metal layer 36 on a second, opposed, face of PCB substrate 32. First metal layer 34 has been etched or otherwise patterned to provide separated metal regions serving as common or ground metal lead 26, power (e.g., $V_{cc}$) lead 24, input connection region 20, transistor base connection region 44, transistor emitter connection region 46, transistor collector connection region 48 and output connection region 22. Metal leads or metal regions 20, 22, 24, 26, 44, 46, and 48 provide the necessary interconnections and attachment locations for electrical components 12, 14–17, 21 and 23 shown in FIG. 1. FIG. 3 is a simplified cross-section through the PCB of FIG. 2.

FIG. 4 shows a simplified plan view of the same PCB as in FIGS. 2 but with the components indicated in FIG. 1 attached to form electronic assembly 50 implementing the circuit of FIG. 1. FIG. 5 show a simplified right side view of the electronic assembly of FIG. 4. Usually, back-plane and/or common metal layer 36 is placed in direct contact with heat-sink 37 to aid in removing heat generated within components 12, 14–17, 21 and 23.

Figure 7:
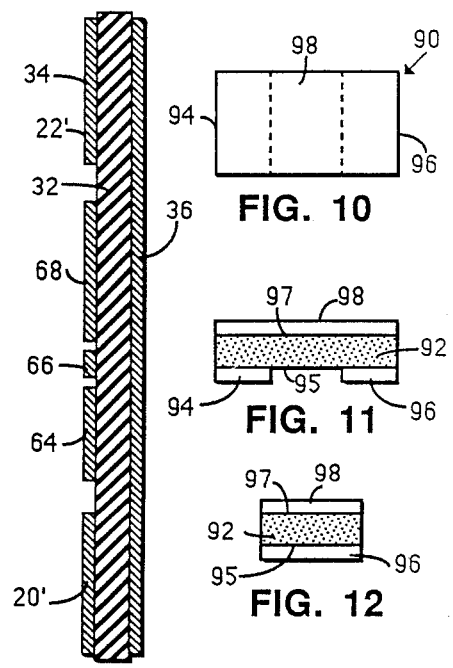
FIG. 7 shows a simplified cross-sectional view of the electronic assembly of FIG. 6 along section line 7—7.

FIG. 6 shows a simplified plan view of PCB 56 similar to PCB 30 of FIG. 2, but where metal layers 34, 36 on substrate 32 have been modified to permit implementation of the circuit of FIG. 1 including thermal shunt components in appropriate locations. FIG. 7 shows a simplified cross-sectional view of the PCB of FIG. 6.

Metal layer 34 of PCB 56 has been etched or otherwise patterned to provide separated metal regions serving as common or ground metal lead 26', power (e.g., $V_{cc}$) lead 24', input connection region 20', transistor base connection region 64, transistor emitter connection region 66, transistor collector connection region 68 and output connection region 22'. Metal regions 20', 22', 24', 26', 64, 66, and 68 provide the necessary interconnections and attachment locations for electrical components 12, 14–17, 21 and 23 shown in FIG. 1. Regions 20', 22', 24', 26', 64, 66, and 68 are analogous to regions 20, 22, 24, 26, 44, 46, and 48, respectively.

Figure 8:
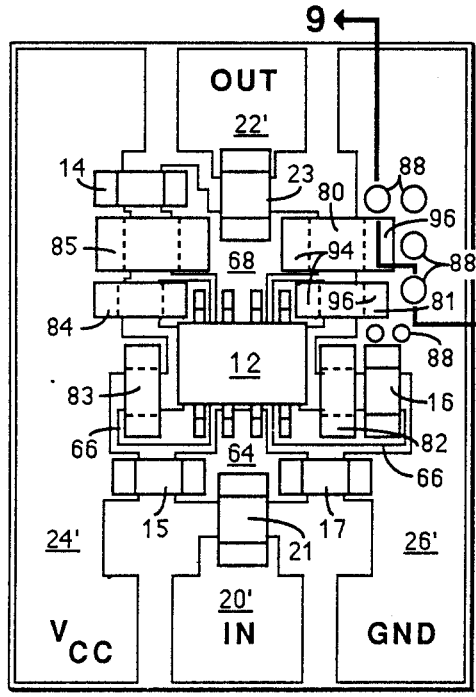
FIGS. 8 shows a simplified plan view of the same PCB as in FIG. 6 with electronic components attached to form an assembly implementing the circuit of FIG. 1 and including one or more thermal shunt components according to the present invention.
Figure 9:
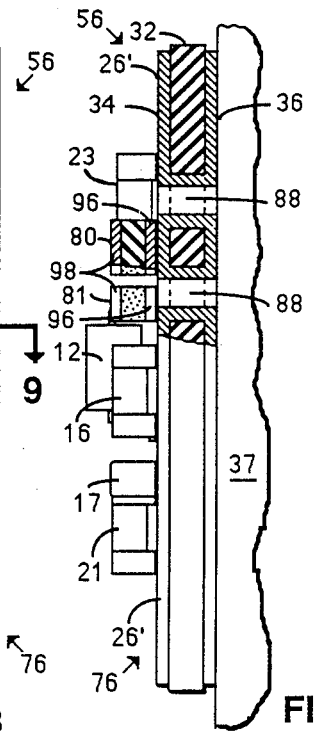
FIG. 9 shows a simplified right side and partial cutaway view along section line 9—9 of the electronic assembly of FIG. 8.

FIG. 8 shows a simplified plan view of the same PCB as in FIGS. 6 with the components shown in FIG. 1 attached to form electronic assembly 76 implementing the circuit of FIG. 1, but according to the present invention including one or more thermal shunts. FIG. 9 shows a simplified right side and partial cut-away view of the electronic assembly of FIG. 8. For convenience, the same or analogous identifying numbers have been used for the physical components in FIGS. 8–9 as for the schematic components in FIG. 1.

The base leads of transistor 12 are attached to base connection lead 64, the emitter leads to emitter connection lead 66 and the collector to collector lead 68. Transistor 12 has the package configuration of a surface mount component with gull-wing leads, e.g., a SO-8 type package. The gull-wing lead arrangement is shown in FIGS, 5 and 9. While this is a typical surface mount lead arrangement for transistors and like parts, those of skill in the art will understand that other well known surface mount transistor package arrangements, such as for example J-lead packages, could also be used. Additionally, other power dissipating devices could be used in place of transistor 12 to form other circuit functions. The exact nature of device 12 is not essential to the present invention. and transistor 12 is used merely as an example for convenience of explanation.

Where component 12 is a plastic encapsulated surface mount transistor, the heat generated within the transistor is dissipated primarily through the collector lead(s), to some extend through the emitter lead(s), and generally only to a small extent through the base lead(s). In addition, some heat is dissipated through the plastic encapsulation. The thermal impedance from the device junction to heat sink 37 in contact with common metal back-plane 36 is the series-parallel combination of the individual thermal impedances, i.e., (i) through the package leads, (ii) through the plastic package body, and (iii) through the various metal and dielectric regions of the PCB from the device leads and package to metal layer 36 and underlying heat sink 37.

It has been found that the total thermal impedance can be substantially reduced by applying thermal shunt components primarily to the collector connection points and secondarily to the emitter connection points, since a large amount of the heat generated within device 12 is extracted, primarily via the collector leads and secondarily via the emitter leads. Thermal shunt component 80 extends between collector connection region 68 and ground region 26', thermal shunt component 85 extends between collector connection region 68 and power lead 24', thermal shunt components 81, 82 extend between emitter connection region 66 and ground region 26' and thermal shunt components 83, 84 extend between emitter connection region 66 and power lead 24'.

In the example shown in FIG. 6, if only one thermal shunt can be accommodated it is desirable to place it approximately in the location of shunt 80 between collector connection region 68 and ground region 26', since the greatest improvement in thermal dissipation can be obtained at that location. Further, since ground or common region 26' is generally at the same electrical potential as underlying common metal back-plane 36, direct metallic connections can be made between ground region 26' and metal back-plane 36 through metallic or other highly thermally conducting connections 88 or the like placed close to the end of heat shunt component 80. This aids materially in lowering the thermal impedance between the collector leads on collector connection region 68 and heat sink 37 beneath back-plane 36.

Figure 10:
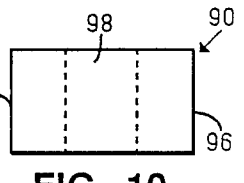
FIG. 10 shows a simplified top view of a thermal shunt component according to a first embodiment of the present invention.
Figure 11:
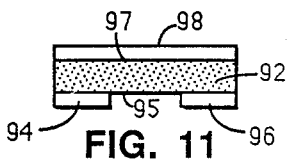
FIG. 11 shows a simplified side view of the thermal shunt component of FIG. 10.
Figure 12:
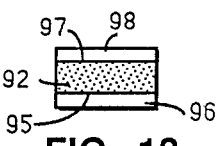
FIG. 12 shows a simplified end view of the thermal shunt component of FIG. 10.

FIG. 10 shows a simplified top view of thermal shunt 90 according to a first embodiment of the present invention. FIG. 11 shows a simplified side view and FIG. 12 shows a simplified end view of the thermal shunt 90. Thermal shunt 90 is exemplary of thermal shunts 80–85 illustrated in FIGS. 8–9. Any type of thermal shunt that is, in general, at least as thermally conducting as the region of the PCB that is occupies, will serve. For example, a parallelepiped of highly thermally conductive ceramic, as for example, beryllia or aluminum nitride or alumina or sapphire or combinations thereof, is useful in lowering the total thermal impedance between heat source and sink on a comparatively low thermal conductivity reinforced plastic board. Generally, it is desirable to use crystalline materials since their thermal conductivity is usually higher than the amorphous form, but amorphous materials are not precluded. The thermal impedance of the shunt may be further reduced by providing metal lands or regions 94, 96, 98 on the ceramic as shown in FIGS. 10–12.

Thermal shunt 90 desirably comprises electrically insulating and highly thermally conducting body 92 with spaced-apart first and second metal attachment regions 94, 96 on first face 95. Third metal region 98 on opposed second face 97 is optional. While thermal conduction from metal region 94 to metal region 96 (or vice-versa) occurs primarily through the bulk of electrical insulator 92, for the same body thickness a smaller thermal impedance can be obtained by having metal region 98 overlap metal regions 94, 96. This provides an additional thermal path from one or the other of spaced-apart regions 94, 96 through electrical body 92 to opposed third metal region 98, along metal region 98 and back through insulator 92 to the other of spaced-apart metal regions 94, 96. Since the thermal conductivity of highly thermally conductive metals such as copper is substantially higher than the thermal conductivity of even the most highly thermally conductive insulators, a lower thermal impedance can result Generally however, similar thermal impedance may be obtained by making body 92 thicker and omitting metal layer 98. Omitting layer 98 minimizes the parasitic capacitance of the thermal shunt.

While the arrangement of FIGS. 10–12 in which thermal shunt 90 is metallized front and back, may increase the capacitance introduced into the circuit by the thermal shunt, it can be shown that the size of this added shunt capacitance is small compared to the decrease in thermal impedance that is obtained. Thus, the added capacitance is ordinarily not a problem. Further, the added capacitance is usually small compared to the shunt capacitance that is already inherent in the PCB itself. By using a thermal shunt that has a thermal conductance at least as large as, and preferably substantially larger than the thermal conductance of the PCB area that it occupies, one can obtain a net improvement in thermal conductance at little if any increase in parasitic capacitance, since metal regions on the PCB which might otherwise create shunt capacitance but which were previously left in place as an aid in removing heat, can now be trimmed away.

In the implementation shown in FIGS. 6–9, thermal shunts 80–85, which are particular implementations of thermal shunt 90 of FIGS. 10–12 of varying dimensions, are attached by metal regions 94, 96 to appropriate portions of metal layer 34. For example, thermal shunt 90 has metal region 94 attached to collector contact region 68 and metal region 96 attached to ground or common region 26'. Metal regions or plated-through holes or other highly thermally conductive means 88 are provided between ground region 26' of top layer 34 and back-plane 36 in the vicinity of metal attachment region 96. It is convenient to attach thermal shunts 90 to metal layer 34 of PCB 56 by the same means used for attaching components 12, 14–17, 21 and 23, but this is not essential. Soldering is a well known means for attaching electrical components to PCB's and also serves well for thermal shunts 90.

It is desirable that thermal shunts 90 have shapes which are substantially the same as the shape of other components used in the assembly, e.g., components 12, 14–17, 21, 23. This permits the thermal shunt components to be placed on and attached to the board by the same techniques and by the same apparatus as used for the other components. Those of skill in the art are aware that automated assembly is increasingly used with surface mount components. In this type of assembly, various components are provided on reels of sticky tape or in compartments of small trays or compartmented tape. A computer controlled arm reaches out an picks the desired component off the tape or tray, orients it, and places it on the PCB in the desired location where it is held in place by, for example, a slightly sticky soldering flux. After all of the components have been placed on the PCB, it is run through a furnace where the solder coated components and/or attachment regions on the PCB are heated to reflow the solder. The surface tension of the molten solder holds the components, including the thermal shunts in place until the solder cools and hardens.

Metal filled or plated-through openings or other highly thermally conductive means 88 are desirably placed between the portion of top metal layer 34 immediately adjacent the end of the thermal shunt and the underlying common layer 36 which is coupled directly to heat sink 37. While metal shunts between layers 34 and 36 are not essential, they are very helpful in reducing thermal impedance to heat sink 37. They may be provided during manufacture of the PCB at little or no added cost. This is because it is common practice to provide metallic connections between ground lead 26' of layer 34 and back-plane 36 for electrical purposes, so additional metallic connections for thermal purposes may be provided at the same time with small effort. Thus, when thermal shunts are to be used, supplementary direct connections 88 are desirably provided between layers 34 and 36 at or near the point of shunt attachment.

Those of skill in the art will appreciate, based on the description herein, that where thermal connections 88, for example, between layers 34 and 36 are metallic, they are electrical conductors and are therefore only appropriate between portions of layers 34 and 36 that are at the same electrical potential. If such direct thermal connections are desired for example, between $V_{cc}$ lead 24' of metal layer 34 and common layer 36 (assumed to be at electrical ground) in addition to or in place of the normal thermal conduction through substrate 32, then a non electrically conducting plug or connection must be used, as for example, a ceramic and/or a combination metal-insulator combination where the insulator provides electrical isolation while facilitating thermal conduction. While this will improve thermal performance, its use may not be justified in applications where extremely low cost is paramount because of the additional expense of providing such a thermally conducting, electrically insulating plug and making thermal connection thereto.

EXAMPLE

The following is an example of how use of one or more thermal shunts can reduce the thermal impedance and increase the achievable output power or extend the operating life of an rf amplifier.

Consider a class C rf amplifier corresponding to the circuit of FIG. 1 and implemented on a circuit board having generally the configuration shown in FIGS. 6–7. Assume that it is desired to achieve the maximum continuous output power under the following set of conditions:

1. The maximum allowable transistor junction temperature is 150° C.;
2. The PC back-plane is thermally coupled with negligible thermal resistance to a heat-sink having a maximum temperature of 80° C.;
3. The rf power transistor is housed in a SO-8 rf type package with $\theta_{jc} = 45°$ C./W and predominant heat transfer is through the collector lead;
4. There is negligible radiative and convective heat loss (i.e., heat transfer is substantially all via conduction through the PCB to the back-plane);
5. The PCB is formed from type FR-4 glass reinforced plastic with 2 oz, copper foil on both sides; and
6. The amplifier is 50% efficient.

Type FR-4 PCB may be obtained from a number of well known sources, as for example, Oak Materials Taiwan LTD., 59 Chung-Yang Rd. Sec. 2, Tu Cheng Hsiang, Taipei Hsien, Taiwan R.O.C. Type FR-4 PCB has a glass reinforced plastic body approximately 0.8 mm (1/32 inch) thick and 2 oz copper foil on each face of about 72 micrometers (0.0028 inch) thickness.

The thermal impedance from the collector lead and pad through the PCB is calculated, without any thermal shunt, to be about 186° C./W. Accordingly, the maximum continuous rf power output that can be achieved under these conditions is about $(150-80)/(186+45) = 303$ milliwatts.

When a thermal shunt of the type illustrated in FIGS. 10–12 the thermal impedance can be substantially reduced. For example, a thermal shunt consisting of a beryllia bar having a length of about 2.2 mm (0.085 inch), a width of about 1.4 mm (0.055 inch) and a thickness of about 0.6 mm (0.025 inch), and including metal attachment regions 94, 96 but not metal layer 98, is added to the amplifier described above so that one end of the beryllia bar is within about 0.4 mm (0.015 inch) of the collector leads of the transistor and the other end of the bar is within about 0.4 mm (0.015 inch) of two plated through holes of about 1.0 mm (0.040 inch) diameter. With this shunt in place, the thermal impedance from the collector lead to the heat-sink is decreased to about 56° C./W. Under these circumstances, the maximum continuous rf power output is increased to $(150-80)/(56+45) = 694$ milliwatts while still maintaining a junction temperature of 150° C. Thus, other things being equal, utilizing the thermal shunt of the present invention permits the rf power output from the amplifier to be more than doubled.

Alternatively, if the amplifier is operated at the original rf power output level of about 300 milliwatts, the transistor junction temperature is reduced by the thermal shunt from about 150° C. to about 110° C., i.e., an improvement of about 40° C. It is well known that transistor operating life (MTBF) approximately doubles for each 10° C. drop in junction temperature. Accordingly, use of the thermal shunt of the present invention can dramatically extend the useful life of the amplifier. This is highly desirable. Further, a beryllia bar of the dimensions described above, has a form resembling commonly used surface mount electronic components (e.g., chip resistors or capacitors, etc.) and is well adapted to be placed on the PCB by automated assembly equipment already developed for handling such conventional surface mount electrical components.

Those of skill in the art will appreciate based on the foregoing description that the present invention provides a means and method for low cost electronic assemblies having improved power dissipation capabilities, and well suited for electronic assemblies utilizing PCB's, especially reinforced plastic based PCB's, and further that it is particularly useful for electronic assemblies adapted for surface mount assembly, especially those adapted for automated assembly using machine placeable surface mount components.

Those of skill in the art will also appreciate based on the foregoing that various modifications may be made in the embodiments of the invention without departing from the spirit and scope thereof, For example and not intended to be limiting, the above-described invention is applicable for use with virtually any type of power dissipating component where some portion of the dissipated power exits through the device leads or other region of the device attached to a thermally conductive land or region on the PCB to which a thermal shunt may also be attached. Also, the abovedescribed invention also applies in situations where the thermal shunt may be connected directly to the device itself without use of an intermediate attachment region on the PCB. It is intended to include these and other variations as will occur to those of skill in the art in the claims that follow.

What is claimed:

1. An electronic assembly comprising:
   an insulating substrate having first and second metal layers on first and second opposed surfaces, respectively, wherein the first metal layer comprises multiple spaced-apart portions;
   a power dissipating component having a first region attached to a first portion of the first layer and a second region coupled to a second portion of the first layer; and
   an electrically insulating thermally conductive heat shunt component extending from the first portion of the first layer to a third portion of the first layer in thermal contact with the second layer.

2. The assembly of claim 1, wherein the heat shunt component occupies a predetermined substrate area having a predetermined first thermal impedance and wherein the heat shunt component has a second predetermined thermal impedance equal to or less than the first predetermined thermal impedance.

3. The assembly of claim 1 wherein the heat shunt component comprises a highly thermally conductive dielectric material having a first continuous metal region on a first surface thereof and spaced-apart second and third metal regions on an opposed second surface thereof, wherein the first metal region on the first surface extends in face-to-face relationship with the second and third metal regions on the second surface.

4. The assembly of claim 1 wherein the heat shunt component comprises a highly thermally conductive dielectric material having spaced-apart first and second metal regions on a first surface thereof and wherein the first metal region is coupled to the first portion of the first metal layer and the second metal region is coupled to the third portion of the first metal layer.

5. An electronic assembly comprising:
   a PCB having opposed top and bottom surfaces;
   first and second spaced-apart metal regions on the top surface and a third metal region on the opposed bottom surface, wherein the third metal region extends beneath the second region;
   a power dissipating component thermally connected to the first region; and
   an electrically insulating and thermally conductive component connected from the first region to the second region.

6. The assembly of claim 5 comprising a further metal region interconnecting the second and third regions.

7. The assembly of claim 6 wherein the further metal region comprises a metal lined hole extending between the second and third regions.

8. The assembly of claim 5 wherein the thermally conductive component has a thermal resistance equal to or less than the thermal resistance of the portion of the PBC occupied by the thermally conductive component.

9. The assembly of claim 5 wherein the thermally conductive component has a form sufficiently similar in shape to other standard components on the PCB so that the thermally conductive component may be placed on the PCB by the same means used for placing the other components.

10. The assembly of claim 5 wherein the thermally conductive component comprises a parallelepiped of highly thermally conducting, electrically insulating dielectric with spaced-apart metal attachment zones on one face for attachment to the first and second metal regions on the PCB.

11. The assembly of claim 10 wherein the thermally conductive component further comprises a third metal zone on an opposite face of the dielectric an extends in face-to-face relationship with but not contacting the first and second zones.

12. The assembly of claim 10 wherein the dielectric comprises a crystalline material.

13. The assembly of claim 12 wherein the dielectric comprises a ceramic.

14. A process for forming an electronic assembly comprising the steps of:
   providing a PCB having a first metal region for receiving a thermal connection from a power dissipating component, a second metal region on the same face of the PCB and spaced-apart from the first metal region, and a third metal region on an opposite face of the PCB and thermally coupled to the second metal region; and
   then in either order performing the further steps of, (i) placing a power dissipating component in thermal contact with the first metal region and (ii) placing an electrically insulating and thermally conducting component between the first and second metal regions and thermally coupled thereto.

15. The process of claim 14 wherein the step of providing a PCB comprises providing a PCB with one or more metal regions extending between the second and third metal regions in close proximity to the thermally conducting component.

16. The process of claim 15 wherein the step of providing a PCB with one or more metal regions comprises providing one or more plated through holes.

17. The process of claim 14 wherein the step of placing an electrically insulating and thermally conducting comprises placing an electrically insulating and thermally conducting component having a thermal impedance equal to or less than the thermal impedance of a region of the PCB equal in area to the PCB area occupied by the thermal component.

* * * * *